(12) United States Patent
Chen et al.

(10) Patent No.: US 6,983,205 B2
(45) Date of Patent: Jan. 3, 2006

(54) COMPRESSING LOCATION DATA OF MOVING OBJECTS

(75) Inventors: Ying Chen, Beijing (CN); Fang Yan Rao, Beijing (CN); Xiu Lan Yu, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 10/729,225

(22) Filed: Dec. 5, 2003

(65) Prior Publication Data

US 2004/0158398 A1    Aug. 12, 2004

(30) Foreign Application Priority Data

Dec. 6, 2002 (CN) .............................. 02154031 A (51) Int. Cl.
  G01C 21/26  (2006.01)
  G06F 19/00  (2006.01)
(52) U.S. Cl. .................. 701/209; 701/35; 701/210; 340/991; 340/995.25; 707/101
(58) Field of Classification Search ................ 701/209, 701/210, 211, 214, 200, 207, 35, 201, 202; 340/989, 991, 992, 993, 995.15, 995.18, 340/995.25; 455/456.1, 456.2, 456.3; 342/358; 707/10, 101, 102
See application file for complete search history.

(56) References Cited

U.S. PATENT DOCUMENTS 6,374,177 B1 * 4/2002 Lee et al. .................. 701/200
6,421,602 B1 * 7/2002 Bullock et al. ............ 701/201
6,691,028 B2 * 2/2004 Bullock et al. ............ 701/202

* cited by examiner

*Primary Examiner*—Tan Q. Nguyen
(74) *Attorney, Agent, or Firm*—Louis P. Herzberg (57) ABSTRACT

Provides methods, apparatus and system for compressing a large number of continuous location data of moving objects. A large number of continuous location data of moving objects sent from a mobile unit or a locating device are received, these location data are compressed and inserted the compressed location data into a database, so as to solve the problem that the data can not work under a high insertion frequency, and reduce the storage space of continuous locations while maintaining certain location query precision. An example apparatus for compressing the location data of moving objects, comprises: input interface for receiving current location data of a moving continuously; data compressing unit for compressing the location data received via said input interface; and output interface for outputting compressed location data of the moving object.

20 Claims, 8 Drawing Sheets

COMPRESSING LOCATION DATA OF MOVING OBJECTS

TECHNICAL FIELD

The present invention relates to compressing location data of moving objects. In particular, to compressing the location data of a large number of moving objects during a continuous time while maintaining location query precision.

BACKGROUND ART

A plurality of methods have been proposed for locating moving object, such as the Global Positioning System (GPS) which can locate object with high location precision (A GPS satellite constellation transmits to the ground such two kinds of spread spectrum codes as C/A code and P code. The C/A code is for civil usage, and its locating precision is about 100 meters and can be enhanced to 10 meters when using the difference code technology. The P code with higher precision is for military code, its locating precision is less than 10 meters and its velocity precision provided is 0.06–0.1 m/s). In addition, the current cell phones can be located by a base station, but the locating precision is relatively low (The locating precision depends on the radius of the located cell. For example, in the urban area of Beijing, the density of base stations is relatively high and the location precision can reach about 200 meters with technology of cell of origin, while in the rural area the density of base stations is relatively low and the locating precision can only reach one or two kilometers).

Figure 1:
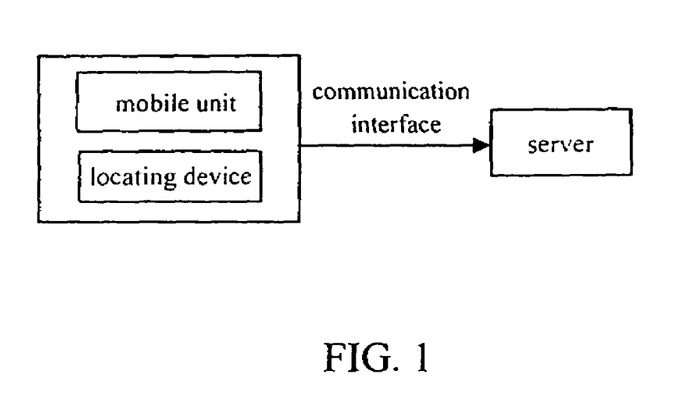
FIG. 1 shows the structure of a moving object database system.

At present, the existing systems utilize these locating technologies to continuously locate moving objects and store the obtained location data in a database, thereby many kinds of queries can be executed based on the location data of moving objects in the database. We refer to the whole system as a moving object database (MOD). Therefore, as shown in FIG. 1, the hardware of the moving object database system comprises: a mobile unit, a locating device, a communication interface and a server where the database is located. The mobile unit is a device which is installed on a moving object and can be monitored, such as a mobile phone, a GPS receiver, etc. When a GPS receiver is used, both the locating device and the mobile unit together are often called a mobile unit. They send the location data of moving objects into the database via the communication interface and the database offers an external query and other service interfaces.

The following are some examples of database query applications: While a person is entering the range of 500 meters near McDonald, an E-coupon is sent to his/her mobile phone by the service provider; and a taxi company manager can query the locations of the taxies belonging to his company from 9:00 AM yesterday to 2:00 PM today, etc. The MOD can be used in taxi management, logistics, location-based service, etc.

In such a system, if a discrete point model for storage is used in database, i.e., the location data at a discrete time point are recorded by the database, in order to record the locations of the discrete time points of moving objects, large number of locations of moving objects should be tracked in real time, in other words, the frequency for tracking moving objects is very high, then a lot of location data of moving objects will be inserted to the database in a unit time. On one hand the database can not stand such a high inserting rate, and on the other hand a lot of storage space is needed. Let us take a moving object database system of taxi management as an example here to give further explain: suppose there are 30,000 taxis in total in a taxi company, each taxi is located per minute and its location data is sent to a database, then 500 inserting operation will be executed by the database in one second. The database can not sustain such high rate data insertion operations, and such a moving object database system can not work normally.

Another problem is for the storage space. The location query at non-sampled time points generally uses technologies such as linear interpolation or fitting. Taking linear interpolation as an example, the object location X at the time of T ($T_1 \leq T \leq T_2$) is the linear interpolation between the object location $X_1$ at the time of $T_1$ and the object location $X_2$ at the time of $T_2$, as shown in the following formula.

$$X = X_1 + \frac{X_2 - X_1}{T_2 - T_1} \cdot (T - T_1) \qquad (1)$$

Figure 2:
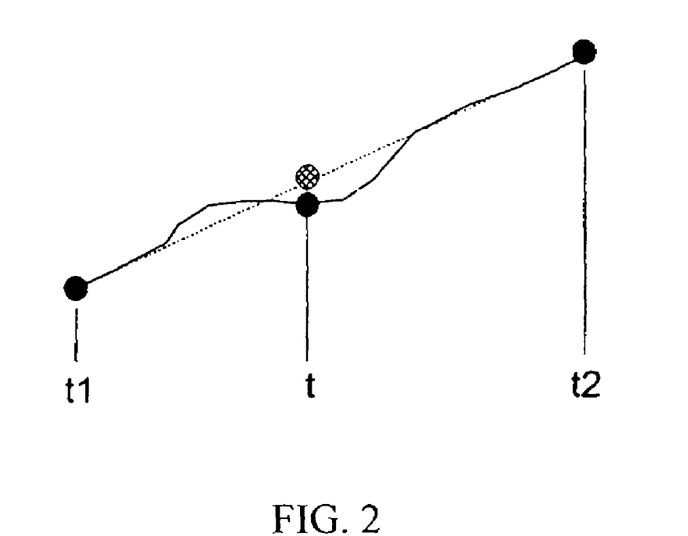
FIG. 2 shows a schematic diagram of location query error.

FIG. 2 shows the error of location query, which is the distance between the interpolated location and the actual location of the point.

Thinking the locations stored in the database are 2-Dimension data for recording the locations of the taxies of the taxi company and each location needs 16 bytes, then the service providers for the taxi company have to store 659.1M data a day, 19.3G data a month, and nearly 235G data a year. Still only the situation of pure data storage except the aspect of database management, such as indexing, is considered. The great data storage capacity is also difficult for database management, and the expense for storage space can not be negligible.

If we can compress such data and saved the compressed data in the database, then the above problems can be solved effectively. The compression can be considered in the following several aspects:

(1) Taking the redundancy-removing filtering method used in U.S. Pat. No. 6,327,533 B1 as an example, a time or displacement threshold is set, and if the time or displacement of an object does not exceed the threshold, then the location of the moving object will not be recorded, thereby achieving the compression. What is recorded in the database is still the location of the moving object, and the query process is very convenient. But when a lot of moving objects are moving concurrently, the method is ineffective, there are still a lot of insertion operations in the database and the system is possibly incapable of operating normally.

(2) Constant speed translational movement is a kind of very important movement for moving objects. In U.S. Pat. No. 5,187,689, it is also mentioned that translational motion can be translationally predicted, using this kind of linear prediction method can also reduce storage space, and what is recorded in the database is still the locations of the object, which is very convenient for query process. But when a lot of moving objects are moving randomly nearby, the compression ratio is very low, there are still a lot of insertion operations in the database, and the system is also possibly incapable of operating normally.

(3) The motion traces of the object can be treated as data curve. By performing data regression or transformation on these curves and storing the regression coefficients or the transformation coefficients in the database, the compression can also be achieved. But this method has two disadvantages as follows: (a) the relationship between the errors of the fitted or transformed curve, and the original curve, and the mathematical format of the curve is usually very complicated and difficult to be obtained, while using a curve fitting in a fixed manner is difficult to ensure the precision when performing a query on locations; (b) a complicated inverse transformation should be conducted when querying locations, which greatly influences the speed of query process. Many query operations of the database can not carried out directly.

SUMMARY OF THE INVENTION

In order to solve the above-mentioned problem, the present invention provides methods, systems and apparatus for compressing large number of continuous location data of moving objects. A large number of continuous location data of moving objects sent from a mobile unit or a locating device are received, these location data are compressed and inserted the compressed location data into a database, so as to solve the problem that the database can not work under a high insertion frequency, and reduce the storage space of continuous locations while maintaining certain location query precision.

According to one aspect of the present invention, there provided a method for compressing large number of location data of moving objects during continuous time, comprising the steps of: a) receiving current location data of a moving object; b) determining whether the object was in motion of translation previously; c) if determined in step b) the object was in translational motion, determining whether the object continues to move translationally after taking account of the current location, if yes, not updating the location data; d) if determined in step c) the translational motion is no longer observed after taking account of the current location, updating the location data and returning to step a); and e) if determined in step b) the object was not in translational motion previously, determining whether the object is moving randomly nearby, if yes, not updating the location data, otherwise updating the location data, setting the object in motion of translation and returning to step a).

According to another aspect of present invention, there provided an apparatus for compressing the location data of moving objects, comprising: input interface for receiving current location data of a object moving continuously; data compressing means for compressing the location data received via said input interface; and output interface for outputting compressed location data of the moving object, wherein said data compressing means comprises: linear model processing unit for determining, when the moving object was in motion of translation previously, whether the moving object continues to move translationally after taking account of the current location, if yes, not updating the location data, and if no, updating the location data; and simple threshold model processing unit for determining, when the moving object is not moving translationally, whether the object is moving randomly nearby, if yes, not updating the location data, otherwise updating the location data.

BRIEF DESCRIPTION OF DRAWINGS

The present invention can be understood more easily from the following detailed description when taken in conjunction with the accompanying drawings in which identical reference signs indicate parts of the same structure, and in which.

DESCRIPTION OF THE INVENTION

The present invention provides methods, systems and apparatus for compressing large number of continuous location data of moving objects, which receives a large number of continuous location data of moving objects sent from a mobile unit or a locating device, compresses these location data and inserts the compressed location data into a database, so as to solve the problem that the database can not work under a high insertion frequency, and reduce the storage space of continuous locations while maintaining certain location query precision.

There is provided a method for compressing large number of location data of moving objects during continuous time, comprising the steps of: a) receiving current location data of a moving object; b) determining whether the object was in motion of translation previously; c) if determined in step b) the object was in translational motion, determining whether the object continues to move translationally after taking account of the current location, if yes, not updating the location data; d) if determined in step c) the translational motion is no longer observed after taking account of the current location, updating the location data and returning to step a); and e) if determined in step b) the object was not in translational motion previously, determining whether the object is moving randomly nearby, if yes, not updating the location data, otherwise updating the location data, setting the object in motion of translation and returning to step a).

In the method for compressing large number of location data of moving objects during continuous time according to the present invention, the step of updating the location data includes selecting a location queue with variable length, storing the compressed location data of the moving object into the variable location queue, then from said location queue, inserting the location data of the moving object at different time into a database at an acceptable data insertion rate of the database.

There is also provided an apparatus for compressing the location data of moving objects, comprising: input interface for receiving current location data of a object moving continuously; data compressing means for compressing the location data received via said input interface; and output interface for outputting compressed location data of the moving object, wherein said data compressing means comprises: linear model processing unit for determining, when the moving object was in motion of translation previously, whether the moving object continues to move translationally after taking account of the current location, if yes, not updating the location data, and if no, updating the location data; and simple threshold model processing unit for determining, when the moving object is not moving translationally, whether the object is moving randomly nearby, if yes, not updating the location data, otherwise updating the location data.

In the method and apparatus for compressing large number of continuous location data of moving objects according to the present invention, the procedure is: when the location data of an object are received, first determining whether the object was in motion of translation previously and whether the object continues to move translationally after taking account of the current location, if yes, not updating the location data in a location queue; if the translational motion is no longer observed after taking account of the current location, updating the location data in the location queue; if the object was not in translational motion, determining whether the object is moving randomly nearby, if yes, not updating the location data in the location queue, otherwise updating the location data in the location queue. The whole process can be automatically switched. Then the location queue inserts the location data of the moving object at different time into a database at an acceptable data insertion rate of the database. Accordingly, the compression ratio of the data can be increased, the insertion operations of the database can be reduced and the normal operation of the system can be ensured. Meantime, the complicated operations of transformation and inverse transformation such as fitting can be avoided and the time for query process can be reduced.

An example embodiment of the present invention will be described in detail hereinafter in conjunction with the drawings. In the method and apparatus for compressing large number of continuous location data of moving objects according to the present invention, the locations of moving objects can come from various devices such as a GPS receiver, a wireless network, etc., and the locations of an object at different time can come from various devices, but various locations have been projected to a plane location and the obtained location data can have various precisions.

In the method and apparatus for compressing large number of continuous location data of moving objects according to the present invention, the road topology and physical structure of the moving areas of large number of moving objects can be stored in advance or not stored.

In the method and apparatus for compressing large number of continuous location data of moving objects according to the present invention, first the continuous locations of moving objects are compressed, and then the compressed locations are inserted in a database. What stored in the database are the locations of various moving objects at various discrete time points.

The method for compressing large number of continuous location data of moving objects according to the present invention will be described in detail hereinafter in conjunction with the drawings. As a whole, the method can be divided into such two big parts as location queue process and location data compression.

1. Location Queue Process

Figure 3:
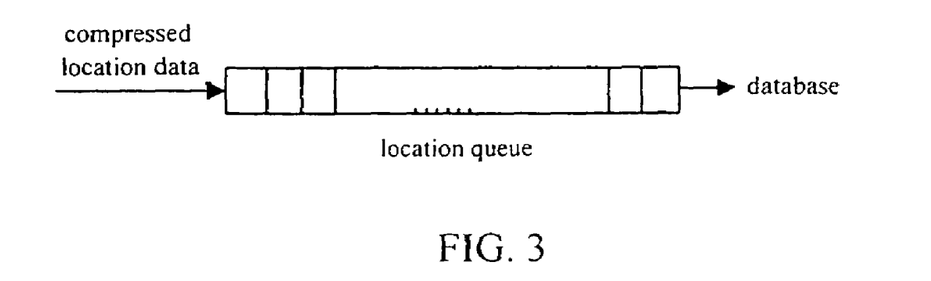
FIG. 3 shows the principle of location queue process.

FIG. 3 shows the principle of location queue process. In the location queue processing method according to the present invention, a variable-length location queue is set for storing the compressed locations of moving objects to be inserted in a database, and it can become longer to a certain extent as the received locations increases. When the location of a certain object at a certain time point in the location queue has been inserted into the database, the location will be deleted from the location queue. The location queue can be stored in an internal memory or in form of one or more files.

Figure 4:
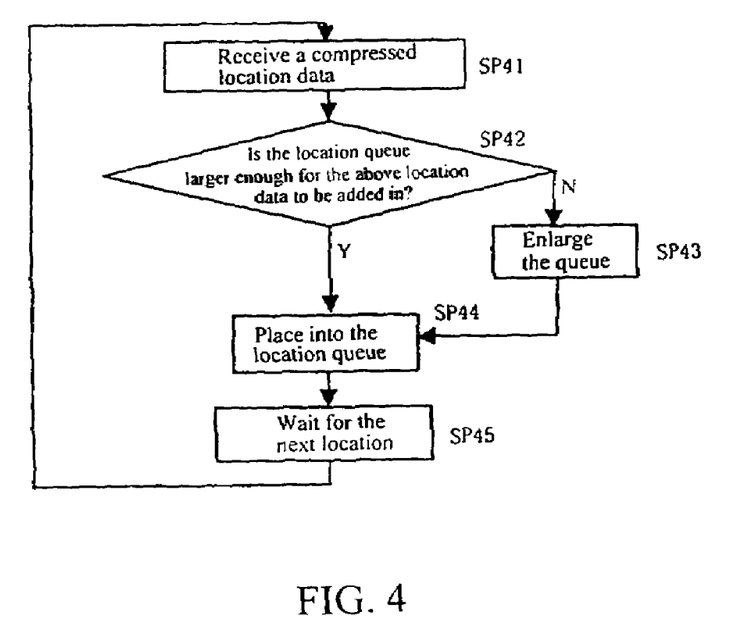
FIG. 4 shows a flowchart of a method for inserting compressed location data into a location queue.

FIG. 4 shows a flowchart of a method for putting the compressed location data into a location queue. First, at step SP41, a compressed location data is received. Then at step SP42, it is determined whether the size of the location queue is big enough to add the location data received at step SP41 into the location queue. If the determination result is "Yes" at step SP42, the process goes to step SP44, where the received location data are put into the location queue. If the determination result is "No" at step SP42, then the location queue is enlarged at step SP43, and the received data are put into the location queue at step SP44. Afterwards, the process returns to step SP41 to wait for the next location data.

Figure 5:
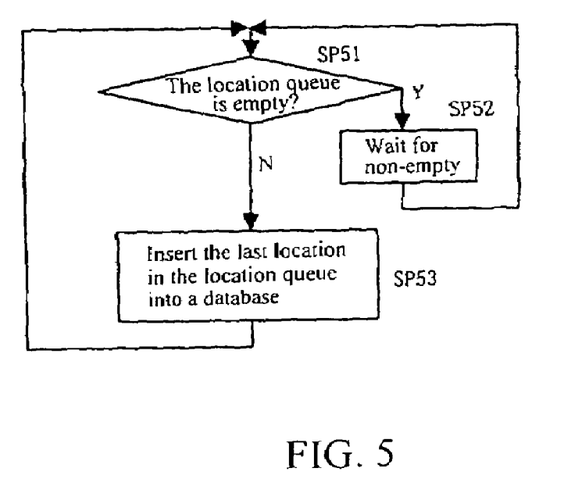
FIG. 5 shows a flowchart of a method for inserting the location data in the location queue of FIG. 3 into a database.

FIG. 5 shows a flowchart of a method for inserting the location data in the location queue of FIG. 3 into a database. As shown in FIG. 5, first at step SP51, it is determined whether the location queue is empty, and if there is no data in the location queue, i.e., the location queue is empty, then wait at step SP52 until the location queue become not empty. Then the process goes to step SP53, where the location data of the last location in the location queue is inserted into the database. Afterwards, the process returns to step SP51 to continue to determine whether new location data are added into the location queue.

Herein before, how to insert compressed continuous location data into a database is described. But as described in the above, before inserting the continuous location data into the database, the continuous location data must be compressed so as to reduce the insertion operations of the database and ensure the normal operation of the system. The method for compressing continuous location data according to the present invention will be described in detail hereinafter.

2. Location Data Compression

Figure 6:
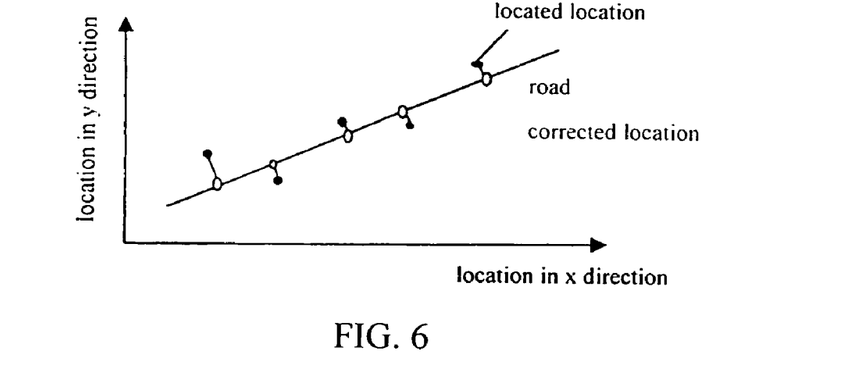
FIG. 6 shows the obtained continuous location of moving objects in the case that there is road topology.

The location of moving objects has a certain errors. Usually in the case that there is a road, the obtained continuous locations of a moving object is as shown in FIG. 6. The solid circle in FIG. 6 indicate the obtained located locations of the moving object, and the hollow circles are the actual locations of the object.

Hereinafter, first how to determine the translational motion in a linear prediction model will be described by dividing into two cases:

(a) if the information of road topology and physical structure and location data are stored and the density of the road grid is not big (the nearest distance between two spatial roads is larger than two times of the locating error), then the corrected location of the moving object can be found by using a spatial indexing. For the obtained location by the GPS, the correction method can also be used to correct it onto the road, thereby obtaining the corrected location of the moving object on the road, as shown with the hollow circles in FIG. 6.

Figure 7:
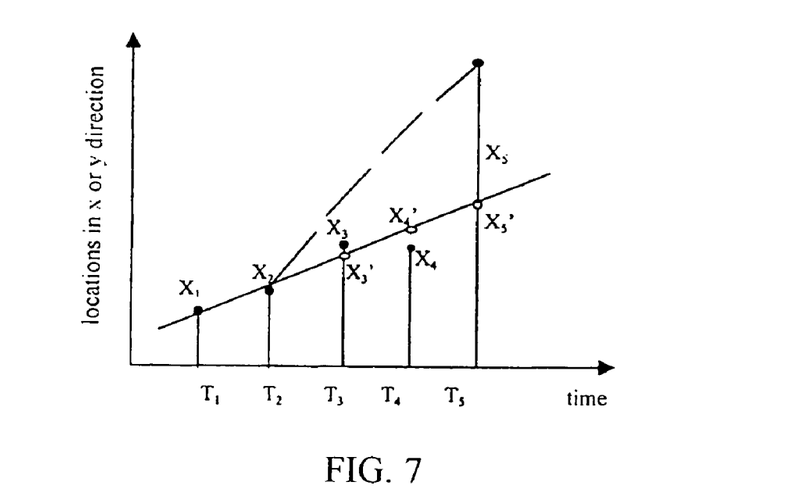
FIG. 7 shows a schematic diagram of performing linear prediction based on corrected moving object location as well as the predicted error exceeding a threshold.

FIG. 7 shows a schematic diagram of performing a linear prediction based on the above-mentioned corrected locations of moving objects, where the solid circle indicates the locations of the moving objects after being sampled and corrected.

If the variation of the velocity of a moving object is small, then taking a first order polynomial linear prediction of double points as an example, the location $X'_3$ of the moving object at time point $T_3$ can be predicted by using the location $X_1$ at time point $T_1$ and the location $X_2$ at time point $T_2$, that is:

$$X'_3 = 2X_2 - X_1$$

Thus a prediction error is obtained:

$$Err(T_3) = |X'_3 - X_3|$$

According to the error of the two directions, the relationship between total prediction error and linear prediction threshold can be determined. Of course a prediction of multiple points can also be used, that is:

$$X_n = f(X_{n-1}, X_{n-2}, \ldots, X_1)$$

But in our experiment, it shows the effect of the first order linear prediction is better.

In this FIG. 7, for the location $X'_5$ at time point $T_5$, the following prediction method is used:

$$X'_5 = 2X'_4 - X'_3$$

instead of using $X_4$ and $X_3$ to predict $X_5$. Thus in the above figure, the locations inserted in the database include $X_1$, $X_2$ and $X_5$, thereby this method is insensitive to the fluctuation of the size of speed with high compression ratio.

(b) In the case that there is no information of road topology and physical structure and location data or in the case that there is such information but the road grid density does not meet the above-mentioned condition and the locating precision is not high, if, according to the received location data of moving objects, we obtain the locations of $X_1$ and $X_2$ of a moving object but the errors of these locations may be locally distributed non-uniformly, for example, the error of location $X_1$ may be small while the error of location $X_2$ is very large resulting in large error in the estimation of speed direction, even if the variation of the absolute value of the object speed is relatively small and the object is moving on a road, the offset of the prediction that the object will be at location $X_3$ at time point $T_3$ is very large, and it is incapable of achieving the effect of compression.

Figure 8:
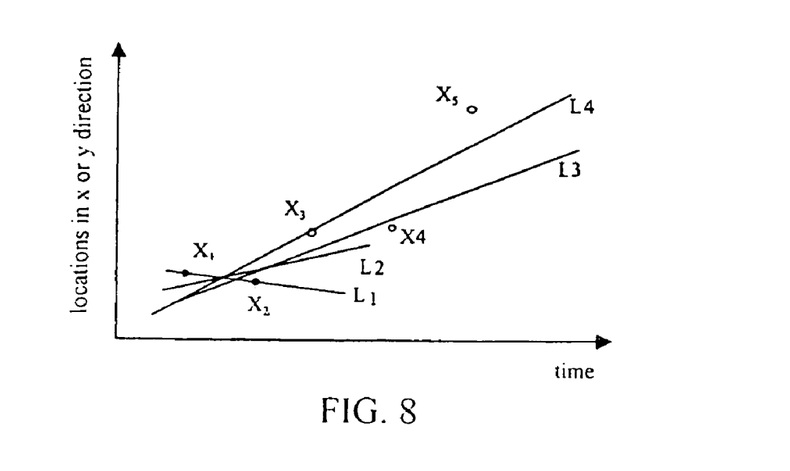
FIG. 8 shows the obtained continuous location of moving objects and the determination of translational motion in the case that there is no road topology.

At this time, we set up a temporary storage space for each object to store the locations satisfying the linear prediction. As shown in FIG. 8, taking Xdirection as an example, first we obtain locations $X_1$ and $X_2$ and put them into the temporary storage space. Because a straight line can be exclusively determined by two points, a flag is set to indicate that the first point satisfies the linear prediction. When location $X_3$ is reached, if the previous points satisfying the linear prediction, a straight line regression is performed with $X_1$, $X_2$, and $X_3$ to obtain the expression of straight line L1:

$$X(t) = K_1 \cdot t + B_1$$

In the formula, t indicates time. The times corresponding to locations $X_1$, $X_2$, and $X_3$ can be substituted into the above formula to obtain the error of the fitted straight line corresponding to the time points. Likewise, the error on Y direction can be obtained, thereby obtaining the composite error of every time point. If the composite error of every point is within a prescribed threshold range, then $X_1$, $X_2$, and $X_3$ satisfy the linear prediction, and point $X_3$ needs not be stored in a location queue. Likewise, point $X_4$ into straight line L2 also needs not be stored in the location queue.

But when point $X_5$ is added, the composite error of some points will exceed the prescribed threshold range, then point $X_5$ destroys the linear prediction and will be stored in the location queue, at which time the temporary storage space of the locations satisfying linearity of the object should be cleared up.

In the above, two cases are used to discuss how to determine an object is in translational motion, but the following process should further be added into translational motion. If the speed of a moving object suddenly changes much, then according to the aforementioned linear determination method with road topology and physical structure stored, when querying during the time of $T_1$–$T_5$, the location of the moving object will be on the dash line shown in FIG. 7. Obviously the error is large. If the location $X_4$ is recorded at previous time point, then the location query error will be very low. But if the location at previous time point is always recorded, then the compression ratio will be greatly reduced.

In order to solve the problem, in the method for compressing large number of continuous location data of moving objects according to the present invention, the following data are stored with respect to each moving object:

A current location of the object received in real time, which is updated in real time, and is called PresentLoc;

A last recorded location of the object in the database, which is updated in real time, and is called LastLocInDB;

A corrected location at previous time point of the current sampled location of the moving object, which is updated in real time, and is called LastLocSamp. That is, in FIG. 7, when reaching location $X_5$, LastLocSamp=$X_4'$, and the location is also the location at fitting point when adopting linear fitting;

A corrected location at previous time point of LastLocSamp in case of having stored the information of road topology and physical structure and location data, which is updated in real time, is called BeforeLastLocSamp;

The number of sampled points satisfying the linear prediction of the moving object, which is updated in real time, and is called PredAddNum;

A linear prediction error threshold of the moving object, which is set as a fixed value according to location query precision, is called PredThresh;

Another special threshold is set as fixed value according to required query precision, which is called PredSpecilThresh; and The threshold for the number of sampled points, which is set as fixed value according to query precision, is called NumThresh.

Figure 9:
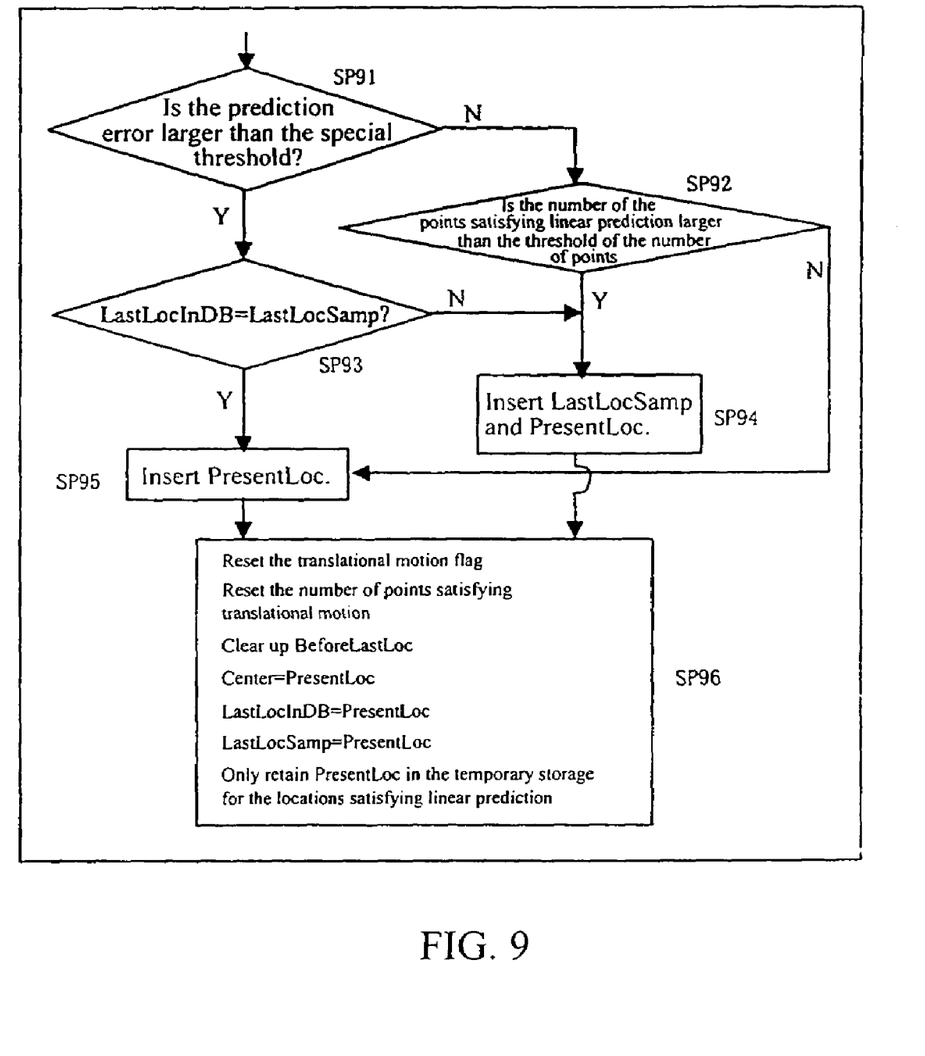
FIG. 9 shows a flowchart of a method for compressing the location data of a moving object when the moving object suddenly changes its speed.

If the location error of the linear prediction is larger than the threshold but a linear prediction model is satisfied at the preceding several time points, as shown in FIG. 7, if only the locations at time points $T_1$, $T_2$, and $T_5$ are recorded, then the location error at time point $T_4$ will exceed the threshold range. At this time, the method as shown in the flowchart of FIG. 9 is used to further process the compressed data needed to be stored. The method is for further enhancing location query precision, and if the location query precision required by an application is not very high, then the step can be omitted.

As shown in FIG. 9, first at step SP91, it is determined whether the predicted error is larger than the special threshold. If the predicted error is not larger than the set special threshold, then the process goes to step SP92 to determine whether the number of points satisfying the linear prediction is larger than the threshold of the number of sampled points. If the number of points satisfying the linear prediction is larger than the threshold of the number of sampled points, then the process goes to step SP94 to insert LastLocSamp and PresentLoc in the database. If at step SP92 it is determined that the number of points satisfying the linear prediction is not larger than the threshold of the number of sampled pointsthen the process goes to step SP95 to insert PresentLoc into the database.

If it is determined that the predicted error is larger than the set special threshold at step SP91, then the process goes to step SP93 to determine whether LastLocInDB is equal to LastLocSamp, and if LastLocInDB is not equal to LastLocSamp, then LastLocSamp and PresentLoc are inserted into the database at step SP94. If it is determined that LastLocInDB is equal to LastLocSamp at step SP93, then the process goes directly to step SP95 to insert PresentLoc into the database.

Then after the completion of the processing at step SP94 or SP95, the process goes to step SP96, where the translational motion flag is reset, the number of the points satisfying translational motion is reset, BeforeLastLoc is cleared up, and the center locations Center, LastLocInDB and LastLocSamp of the object moving randomly near a certain location are reset equal to PresentLoc. And only PresentLoc is retained in the temporary storage space of the locations satisfying the linear prediction.

The above-mentioned relates to the location data compression process when a moving object is in translational motion. In the following description, the process shown in FIG. 9 is called process 1.

Figure 10:
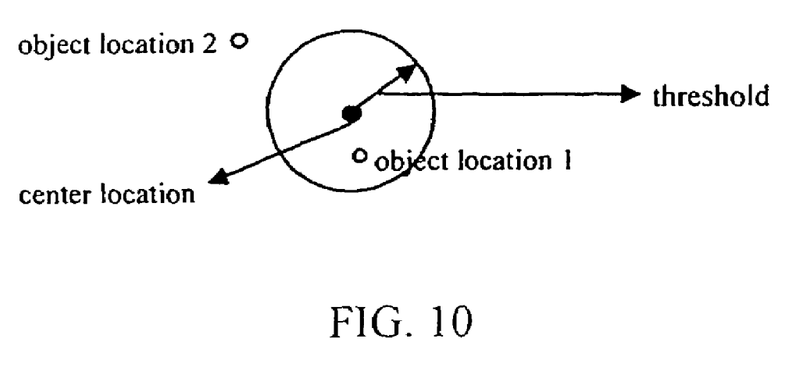
FIG. 10 shows a simple threshold model.

Hereinafter, the location data compression process will be described when a moving object is in translational motion. FIG. 10 shows the condition of an object fluctuating near a certain point without location updating, which, for simplicity of narration, is called a simple threshold model.

In the simple threshold model, if the error between the location of an object and its prescribed center location is smaller than a set threshold, its location in a location queue is not updated, such as the object location 1 in FIG. 10; otherwise, its location is updated in the location queue, such as the object location 2 in FIG. 10.

For a certain object, we need to set the center location of its simple threshold model which is updated and called Center; and set the threshold of its simple threshold model, which is a fixed value set according to location query precision and called SampThresh.

Figure 11:
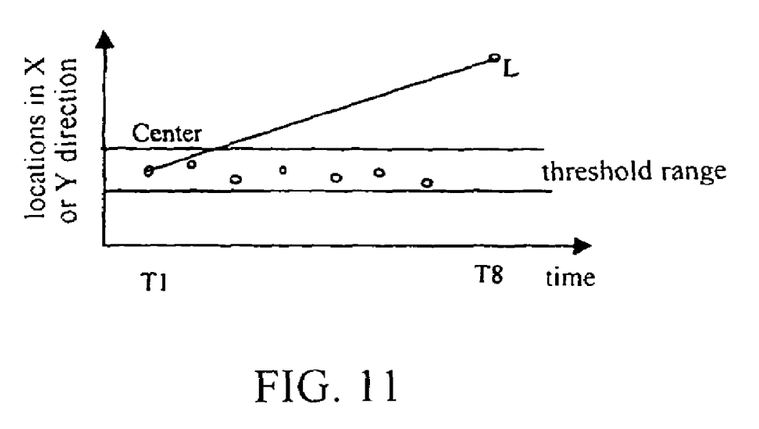
FIG. 11 shows the case that the error exceeds a range under the condition of the simple threshold model.

The simple threshold model also has the same problem as the linear prediction model. That is, when the simple threshold model is satisfied during a relatively long period, as shown in FIG. 11, assuming when time point T8 is reached, then the threshold model is destroyed. If only the locations at time points T1 and T8 are recorded at this time when querying location between T1 and T8 the location on straight line L will be returned. Obviously the query precision will exceed the range.

Herein, the method for compressing large number of continuous location data of moving objects according to the present invention manipulates the simple threshold model by using the same principle as that in the processing of the linear prediction model. The special threshold and the number of points satisfying the simple threshold model are also set, and the number of the points satisfying the simple threshold model is accumulated.

Figure 12:
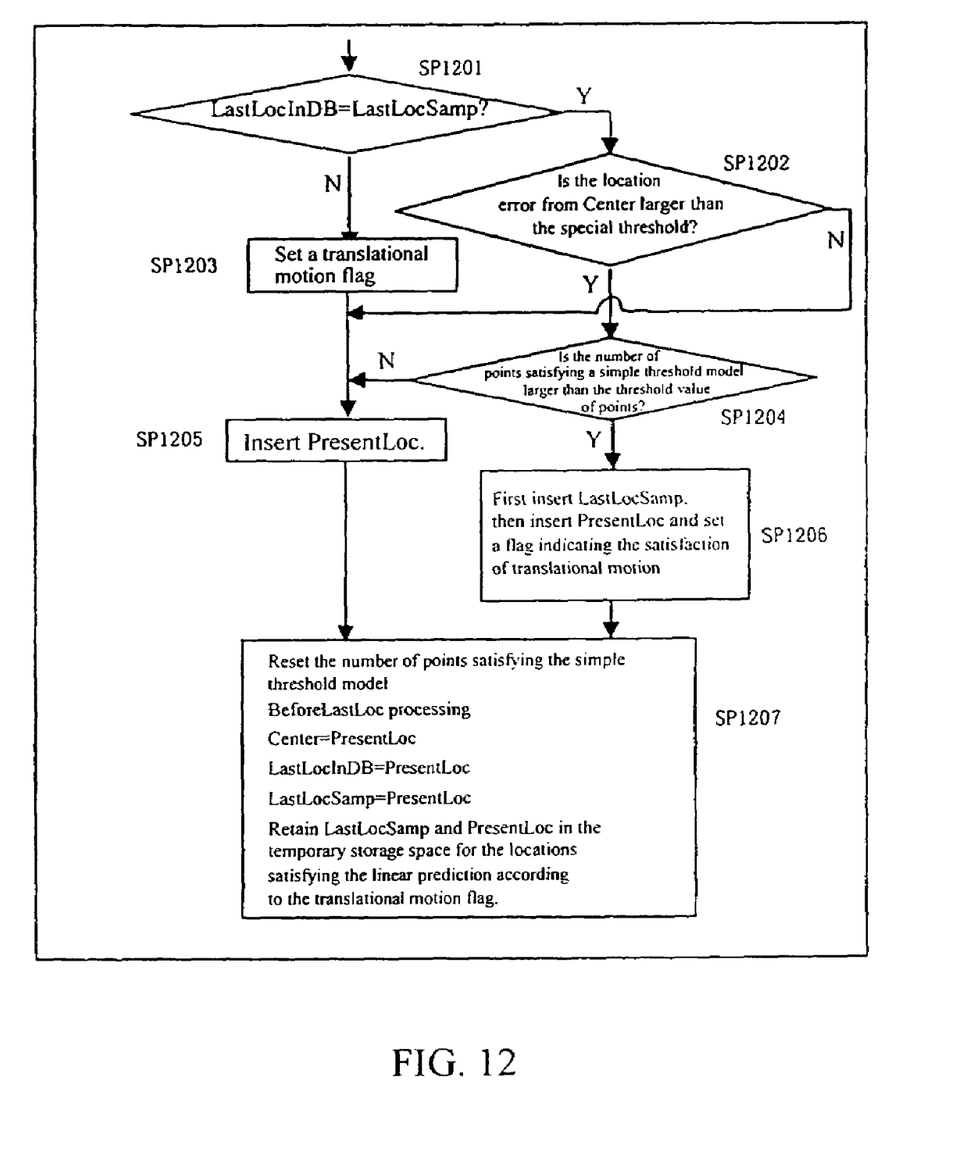
FIG. 12 shows a flowchart of a method for compressing the location data of a moving object when the moving object is moving randomly near a location.

FIG. 12 shows a flowchart of a method for compressing the location data of a moving object when the location of the object exceeds the threshold range in the case that the moving object is moving randomly near a certain location.

As shown in FIG. 12, at step SP1201, it is determined whether LastLocInDB is equal to LastLocSamp, which indicates the points not satisfying the simple threshold model previously. If LastLocInDB is not equal to LastLocSamp, then at step SP1203, a translational motion flag is set, then the process goes to step SP1205.

If at step SP1201, it is determined that LastLocInDB is equal to LastLocSamp, then the process goes to step SP1202 to determine whether the location error from Center is larger than a special threshold, and if the location error from Center is not larger than the special threshold, then the process goes to step SP1205. If it is determined that the location error from Center is larger than the special threshold at step SP1202, then the process goes to step SP1204 to determine whether the number of points satisfying the simple threshold model is larger than a threshold of the number of points, and if the number of points satisfying the simple threshold model is larger than the threshold of the number of points, then the process goes to step SP1206, and if the number of points satisfying the simple threshold model is not larger than the threshold of the number of points, then the process goes to step SP1206.

At step SP1205, PresentLoc is inserted in the database. At step SP1206, LastLocSamp is first inserted in the database, then PresentLoc is inserted into the database and a flag indicating satisfying a translational motion is set.

After the completion of the processing at step SP1205 or SP1206, the process goes to step SP1207, where the number of points satisying the simple threshold model is reset and a previous location datum BeforeLastLoc is processed to be cleared up; it is made Center=PresentLoc, LastLocInDB=PresentLoc and LastLocSamp=PresentLoc; and LastLocSamp and PresentLoc are retained in a temporary storage space of the locations satisfying the linear prediction according to the translational motion flag.

Herein, the special threshold satisfying the simple threshold model is related to the required location query precision, it can be the same as the special threshold of the aforementioned linear prediction, and the threshold of the number of points can also be the same or it can be additionally set. In the following description, the processing method for compressing the location data of the moving object when the moving object is moving randomly near a certain location, as shown in FIG. 12, is called process 2.

Figure 13:
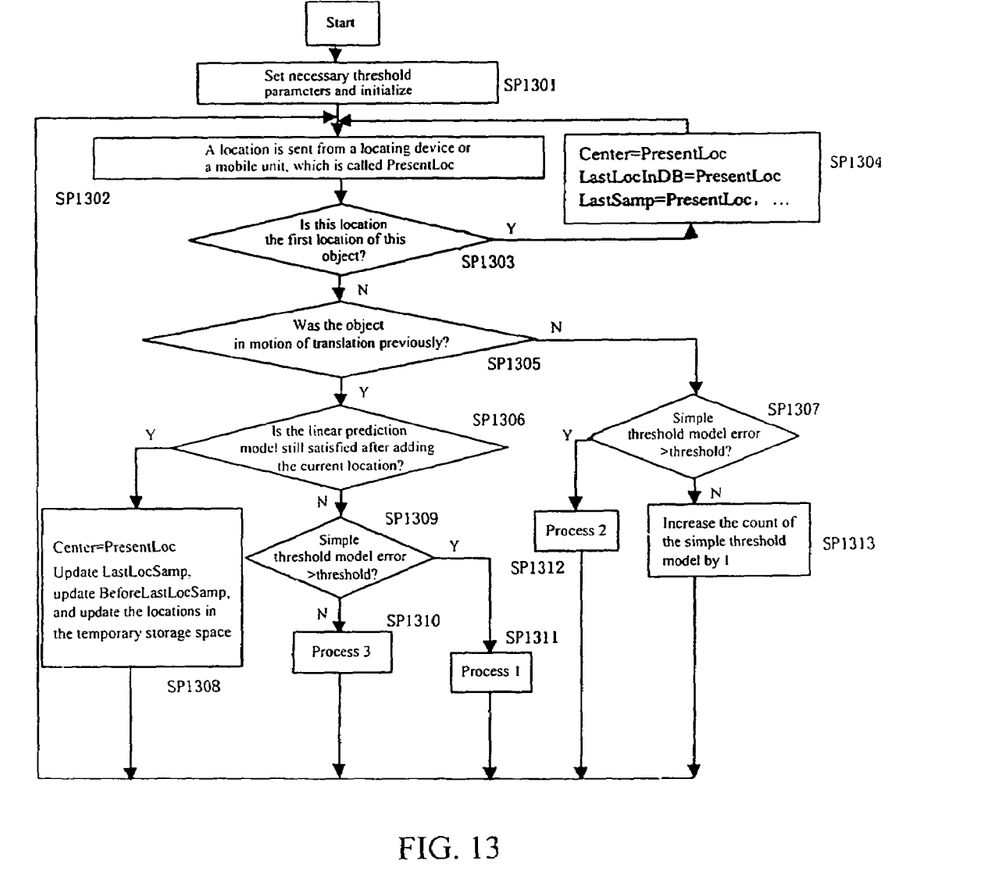
FIG. 13 shows a general flowchart of a method for compressing large number of continuous location data of moving objects according to the present invention.

To sum up the above description, how to perform an automatic switching between such two models as the simple threshold model and the linear prediction model so as to obtain the location data of moving objects of high compression ratio without effecting location query precision, will be described hereinafter in conjunction with FIG. 13. FIG. 13 shows a general flowchart of a method for compressing large number of continuous location data of moving objects according to the present invention. As shown in FIG. 13, at step SP1301, initialization is conduced to set necessary threshold parameters. Then at step SP1302, PresentLoc of a certain locating is received from a locating device or a mobile unit. Next at step SP1303, it is determined whether the object data is location data which comes for the first time, and if it is the location data which comes for the first time, then the process goes to step SP1304 to make Center=PresentLoc, LastLocInDB=PresentLoc and LastSamp=PresentLoc. Then step SP1302 is returned and location data are continued to be received from the locating device or the mobile unit.

If it is determined at step SP1303 that the received location data is not the object's first location data, then the process goes to step SP1305 to determine whether the last location satisfies the linear prediction model. If the last location does not satisfy the linear prediction model, then it is determined at step SP1307 whether the error of the simple threshold model is larger than the set threshold.

If it is determined at step SP1307 that the error of the simple threshold model is larger than the set threshold, then the process goes to step SP1312 to perform aforementioned process 2. Otherwise the process goes to step SP1313 to increase the count of the simple threshold model by 1.

After the completion of the process 2 at step SP1312 and the process 1 at step SP1313, step SP1302 is returned and location data are continued to be received from the locating device or the mobile unit.

If at step SP1305 it is determined that the last location satisfies the linear prediction model, then the process goes to step SP1306 to determine whether the linear prediction model is still satisfied after adding to the current location. If the linear prediction model is still satisfied after adding to the current location, then the process goes to step SP1308 to make Center=PresentLoc, update LastLocSamp, BeforeLastLocSamp and the temporary storage space. Then, step SP1302 is returned and location data are continued to be received from the locating device or the mobile unit.

If it is determined at step SP1306 that the linear prediction model is no longer satisfied after adding to the current location, then the process goes to step SP1309 to determine whether the error of the simple threshold model is larger than the set threshold. If the error of the simple threshold model is not larger than the set threshold, then the process goes to step SP1310 to perform the following process 3: inserting LastLocSamp into the database; resetting the translational motion flag; incrementing the count of the simple threshold model by 1; updating LastLocSamp; updating BeforeLastLocSamp; and updating the temporary storage space.

If it is determined at step SP1309 that the error of the simple threshold model is larger than the set threshold, then the process goes to step SP1311 to perform the above-mentioned process 1.

After the completion of process 3 at step SP1310 or process 1 at step SP1311, step SP1302 is returned and location data continued to be received from the locating device or the mobile unit.

Herein the setting of all of the thresholds is determined comprehensively after taking account of such elements as locating precision, application field, required location query precision and the compression ration needed to be reached. For a usual location-based advertisement for mobile phone locating, the compression ratio of over 5 times can be reached by setting a threshold of 200–300 meters, so that the requirement of a general application can be met.

The method for compressing large number of continuous location data of moving objects according to the present invention has been described above in conjunction with the drawings. An apparatus for compressing large number of continuous location data of moving objects, which realizes the above-mentioned method, will be described hereinafter.

Figure 14:
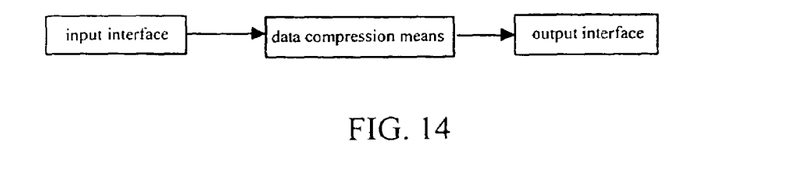
FIG. 14 shows a block diagram of an apparatus for compressing large number of continuous location data of moving objects according to the present invention.

As shown in FIG. 14, the apparatus for compressing large number of continuous location data of moving objects comprises: an input interface for receiving large number of continuous location data of moving objects sent from a locating device or a mobile unit, these location data including a moving object, locating precision, current location, etc.; data compressing means for compressing the location data received via the input interface; and an output interface for outputting compressed location data of moving objects to a database or recording it in files.

The precision required by a user can be ensured by setting various thresholds in the data compressing means to perform a query on the compressed location data.

The data compressing means comprises: a storage unit, a simple threshold model processing unit and a linear model processing unit.

The storage unit comprises: a location queue memory for storing the location data to be inserted into the database after being compressed; a threshold memory for storing a threshold of a simple threshold model, a prediction error threshold of a linear prediction model, a special threshold of the linear prediction model and a threshold of the accumulated number of locations; an intermediate result temporary memory for storing PresentLoc, Center, LastLocInDB, LastLocSamp and PredAddNum of each object, and a flag indicating that a previous location satisfies the linear prediction model. The method using linear fitting to determine linearity should further comprise a temporary memory for storing the locations satisfying linearity of each object.

The linear model processing unit is used to determine whether, when a moving object was in motion of translation previously, the moving object is still in translational motion after adding in a current location data, and if it is still in translational motion then its location data is not updated, otherwise its location data is updated.

Figure 15:
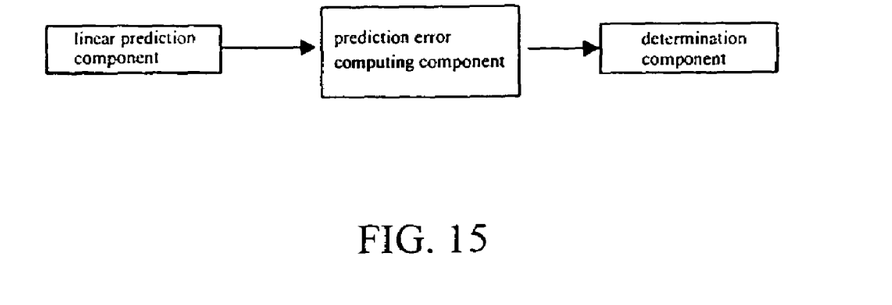
FIG. 15 shows a structural block diagram of a linear model processing unit with the information of road topology and physical structure and location data in a storage unit.

FIG. 15 shows a structural block diagram of the linear model processing unit in the case that the storage unit stores the road topology and physical structure. As shown in FIG. 15, in this case, the linear model processing unit comprises: a linear prediction unit for performing a linear prediction on the location of an object at a current time point by using the locations of the object at several previous time points; an prediction error computing component for computing a prediction error; and a determination component for confirming the moving object is still in translational motion if the prediction error is within a linear prediction threshold range.

Figure 16:
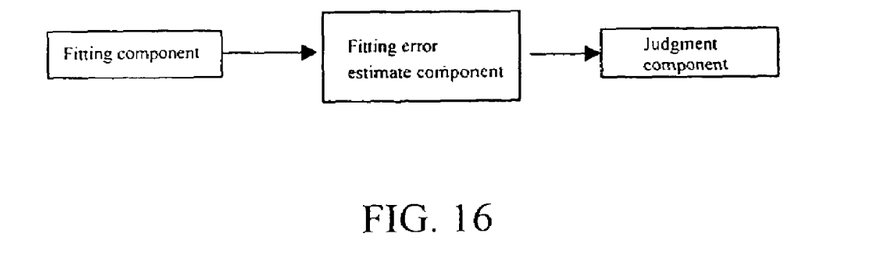
FIG. 16 shows a structural block diagram of a linear model processing unit in the case of no storing the information of road topology and physical structure and location data in a storage unit.

In the case that the storage unit does not store the topology and physical structure, the structure of the linear model processing unit is as shown in FIG. 16. In this case, the linear model processing unit comprises: a fitting component for performing fitting by using the current location and the locations of the object when it was in translational motion previously, so as to obtain a fitted location-time linear equation; a fitting error estimation component for substituting the current time and the previous time of the object when it was in translational motion previously into the fitted location-time linear equation to estimate a fitting error at each time point; and a determination component for confirming the moving object is still in translational motion if the fitting errors of all the time points are within a linear prediction threshold range.

The simple threshold model processing unit is used to perform the above-mentioned process 2, that is, to determine, when the moving object is not in translational motion, if it is still moving randomly nearby, and if Yes, then its location is not updated, otherwise its location is updated.

The simple threshold model processing unit comprises a simple threshold model comparator and a simple threshold model location error calculator.

Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A visualization tool according to the present invention can be realized in a centralized fashion in one computer system, or in a distributed fashion where different elements are spread across several interconnected computer systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

While example embodiments of the present invention have been described in conjunction with the drawings, the present invention is not limited to the embodiments, and various changes can be made without departing from the spirit and scope of the invention as defined by the appended claims.

What is claimed is:

1. A method for compressing large number of location data of moving objects during a continuous time, comprising the steps of:
   a) receiving current location data of a moving object;
   b) determining whether the object was in motion of translation previously;
   c) if determined in step b) the object was in translational motion, determining whether the object continues to move translationally after taking account of the current location, if yes, not updating the location data;
   d) if determined in step c) the translational motion is no longer observed after taking account of the current location, updating the location data and returning to step a); and
   e) if determined in step b) the object was not in translational motion, determining whether the object is moving randomly nearby, if yes, not updating the location data, otherwise updating the location data, setting the object in motion of translation and returning to step a).

2. The method according to claim 1, wherein the step of updating the location data includes selecting a location queue with variable length, storing the compressed location data of the moving object into the variable location queue, then from said location queue, inserting the location data of the moving object at different time into a database at an acceptable data insertion rate of the database.

3. The method according to claim 2, wherein the topology and physical structure and location data of roads are stored in advance, and the corrected location data of the moving object is obtained by a spatial index before step b).

4. The method according to claim 3, wherein step c) further comprises the sub-steps of:
   c1) using several previous locations of the object to perform linear prediction to the current location of the object;
   c2) computing a prediction error between the predicted current location and the received current location; and
   c3) if the prediction error is within the range of a linear prediction threshold, confirming that the moving object continues to move translationally.

5. The method according to claim 4, wherein said linear prediction is a first order polynomial linear prediction of double points or a first order polynomial linear prediction of multiple points.

6. The method according to claim 5, wherein the step d) further comprises the sub-steps of:
   d1) if determined in step c) the translational motion is no longer observed after taking account of the current location, determining whether the object is moving randomly nearby, if yes, updating the location data and setting the object to be in a state of moving randomly nearby;
   d2) if determined in step d1) the object is not in the state of moving randomly nearby, determining whether the prediction error or fitting error is larger than a specific error threshold of the object set according to a location query precision, if the prediction error or fitting error is larger than the specific error threshold of the object set according to location query precision, determining whether the last recorded location data on the database and the last corrected location data are identical, if yes, recording the current location data, otherwise recording the last corrected location data and the current location data;

d3) if the prediction error or fitting error is not larger than the specific error threshold of the object set according to the location query precision, determining whether the number of the points satisfying the linear prediction are larger than a threshold, if no, recording the current location data, and if yes, recording the last corrected location data and the current location data; and d4) only retaining the current location data in a temporary storage space for locations satisfying the linear prediction.

7. The method according to claim 2, wherein in the case of without stored topology and physical structure and location data of roads in advance, the step c) further comprises the sub-steps of:

c11) obtaining the time-location linear equation through fitting of the current location and previous locations where the object was in translational motion;

c12) substituting the current time point value and the previous time point values when translational motion was satisfied into the time-location linear fitting equation and estimating a fitting error at each time point; and c13) if the fitting errors at all the time points are within the range of linear prediction threshold, confirming that the moving object continues to move translationally and setting the fitting location of the object at each time point as the corrected location.

8. The method according to claim 1, wherein step e) further comprises the sub-steps of:

e1) determining whether the last recorded location data is equal to the last corrected location data, if no, setting a translational motion flag and recording the current location data;

e2) if determined in step e1) the last recorded location data is equal to the last corrected location data, determining whether the location prediction error is larger than the specific threshold set according to the location query precision, if no, only recording the current location data;

e3) if determined in step e2) the location prediction error is larger than the specific threshold set according to the location query precision, determining whether the number of points satisfying moving randomly nearby threshold are larger than a threshold, if yes, recording the last corrected location data and the current location data, otherwise only recording the current location data; and e4) resetting the number of points satisfying moving randomly nearby threshold to zero, clearing up the data of the previous location, and retaining the last corrected location data and the current location data in the temporary storage space for the locations satisfying linear prediction according to the translational motion flag.

9. The method according to claim 1, wherein said location queue resides in memories or exists in form of one or more files.

10. The method according of claim 1, wherein an initialization step is performed before the step a): receiving and recording the first several location data of the moving object, and determining whether the object is in motion of translation or a state of moving randomly nearby according to the received first several location data.

11. An article of manufacture comprising a computer usable medium having computer readable program code means embodied therein for causing compression of a large number of location data of moving objects during a continuous time, the computer readable program code means in said article of manufacture comprising computer readable program code means for causing a computer to effect the steps of claim 1.

12. A program storage device readable by machine, tangibly embodying a program of instructions executable by the machine to perform method steps for compressing large number of location data of moving objects during a continuous time, said method steps comprising the steps of claim 1.

13. An apparatus for compressing location data of moving objects, comprising: input interface for receiving current location data of a object moving continuously;

data compression means for compressing the location data received via said input interface; and output interface for outputting compressed location data of the moving object, wherein said data compressing means comprises:

linear model processing unit for determining, when the moving object was in motion of translation previously, whether the moving object continues to move translationally after taking account of the current location, if yes, not updating the location data, and if no, updating the location data; and simple threshold model processing unit for determining, when the moving object is not moving translationally, whether the object is moving randomly nearby, if yes, not updating the location data, otherwise updating the location data.

14. The apparatus according to claim 13, further comprises storage means for storing the topology and physical structure, location data and the temporary results necessary for data compression.

15. The apparatus according to claim 14, wherein said linear model processing unit comprises:

linear prediction means for predicting the current location of the object with several previous locations of the object;

prediction error computing means for computing a prediction error between the predicted location and the current location; and determination means for confirming the moving object continues to move translationally if the prediction error is within the range of linear prediction threshold.

16. The apparatus according to claim 15, wherein said linear prediction is a first order polynomial linear prediction of double points or a first order polynomial linear prediction of multiple points.

17. The apparatus according to claim 13, wherein said linear model processing unit comprises:

fitting means for performing the regression between time and locations including the current location and the previous locations satisfying translational motion to obtain a fitting time-location linear equation;

fitting error estimation means for substituting the current time value and the previous time values in which translational motion was satisfied into the fitting time-location linear equation and estimating a fitting error at each time point; and determining means for confirming that the moving object continues to move translationally if the fitting errors at all the time points are within the range of linear prediction threshold.

18. The apparatus according to claims 13, wherein said output interface comprising a variable-length location queue which saves the compressed location data of the moving object to be inserted into a database and inserts the compressed location data of the moving object at different time into the database at an acceptable data inserting rate of the database.

19. The apparatus according to claim 13, wherein said location queue resides in memories or exists in form of one or more files.

20. A computer program product comprising a computer usable medium having computer readable program code means embodied therein for causing compression of location data of moving objects, the computer readable program code means in said computer program product comprising computer readable program code means for causing a computer to effect the functions of claim 13.

* * * * *